United States Patent [19]

Hikita et al.

[11] Patent Number: 5,010,269
[45] Date of Patent: Apr. 23, 1991

[54] SAW RESONATOR HAVING A BROAD BANDWIDTH

[75] Inventors: Mitsutaka Hikita, Hachioji; Atsushi Sumioka, Kokubunji; Toyoji Tabuchi, Kodaira; Kazuhito Kurosawa, Katsuta; Tuneo Kinoshita, Kokubunji, all of Japan

[73] Assignees: Hitachi, Ltd.; Hitachi Denshi Kabushiki Kaisha, both of Tokyo; Hitachi Communication System, Inc., Yokohama, all of Japan

[21] Appl. No.: 282,177

[22] Filed: Dec. 9, 1988

[30] Foreign Application Priority Data

Dec. 14, 1987 [JP] Japan .................. 62-314136

[51] Int. Cl.$^5$ .................................. H01L 41/08
[52] U.S. Cl. ...................... 310/313 B; 310/313 D; 333/154
[58] Field of Search ............ 310/313 B, 313 D; 333/193-196, 151, 153, 154

[56] References Cited

U.S. PATENT DOCUMENTS

| 3,866,154 | 2/1975 | Moore | 310/313 DX |
|---|---|---|---|
| 4,200,849 | 4/1980 | Malocha | 333/194 |
| 4,429,246 | 1/1984 | Miyajima | 310/313 B |
| 4,516,093 | 5/1985 | Nyffler | 310/313 BX |
| 4,642,506 | 2/1987 | Lewis | 310/313 D |
| 4,818,961 | 4/1989 | Takahashi et al. | 310/313 DX |

FOREIGN PATENT DOCUMENTS

| 0123222 | 9/1980 | Japan | 310/313 B |
|---|---|---|---|
| 0015519 | 1/1982 | Japan | 333/195 |

OTHER PUBLICATIONS

IEEE Ultrasonics Symposium Proceedings, 1974, pp. 263-267.

Primary Examiner—Mark O. Budd
Attorney, Agent, or Firm—Antonelli, Terry, Stout & Kraus

[57] ABSTRACT

A SAW resonator includes resonating SAW transducer units formed on a piezoelectric substrate and juxtaposed in a direction of propagation of acoustic waves, and a unidirectionally reflecting SAW transducer unit provided in each end of the juxtaposed resonating SAW transducer units on the substrate. Each resonating SAW transducer unit includes first and second SAW transducers connected in series and/or in parallel with each other. Each unidirectionally reflecting SAW transducer unit includes first and second comb-like electrodes having a plurality of first second fingers, respectively, formed on the substrate, in which: two second fingers are interposed between each pair of adjacent two first fingers; at least one reflective stripe is provided between the two second fingers interposed between at least one pair of adjacent two first fingers; and the distances between the reflective stripe and the two second fingers and the widths of the two second fingers are determined such that acoustic waves produced by the fingers of the reflecting SAW transducer units and propagating in a first direction perpendicular to the direction of the length of the fingers and reflected by the reflective stripe in a second direction perpendicular to the first direction are in phase with acoustic waves propagating in the second direction and acoustic waves produced by the fingers of the reflecting SAW transducer units and propagating in the second direction and reflected by the reflective stripe in the first direction are out of phase with acoustic waves propagating in the first direction.

13 Claims, 10 Drawing Sheets

SAW RESONATOR HAVING A BROAD BANDWIDTH

BACKGROUND OF THE INVENTION

This invention relates to a surface acoustic wave (SAW) device, and more particularly to a SAW resonator suitable for application to a broad-band oscillation circuit and the like. The SAW resonator according to the present invention may be used in a voltage-controlled oscillator having a broad variable frequency range or a cellular radio system, for example, a mobile telephone system or a cordless telephone system.

Prior art SAW resonators are discussed in IEEE Ultrasonics Symposium Proceedings, 1974, pp. 263-267. A one-port resonator described in the above publication has such a structure that a reflector formed by depositing an array of thin-film metal stripes on the surface of a substrate or engraving an array of grooves in the surface of the substrate is disposed on either side of a transducer provided on the substrate to produce surface acoustic waves.

In the prior art one-port resonator, the metal stripe array reflector has a narrow bandwidth, and the relative bandwidth, which is expressed as $(f_a-f_r)/fr$ where $f_r$ and $f_a$ are the resonant frequency and the anti-resonant frequency respectively of the resonator, is generally in the order of only 0.01 to 1%. In the prior art one-port resonator, no consideration was given to the fact that the bandwidth of the resonator using such a reflector is further narrowed to about ⅛ to 1/6 of that of the reflector. Because of the lack of the above consideration, a resonator having a very narrow bandwidth could only be realized. Therefore, it has been difficult to realize a resonator which can be incorporated in a voltage-controlled oscillator in a cellular radio system such as a mobile telephone system which requires a bandwidth of about 20 to 40 MHz (a relative bandwidth of about 3 to 5%) in a frequency band of 800 MHz.

SUMMARY OF THE INVENTION

It is an object of the present invention to provide a unidirectional SAW transducer which is useful for constituting, for example, a SAW resonator.

Another object of the present invention is to provide a SAW resonator which can secure a broad bandwidth.

In accordance with one aspect of the present invention, there is provided a unidirectional SAW transducer which comprises a piezoelectric substrate and first and second comb-like electrodes having a plurality of first and second fingers respectively, the first and second fingers being formed on the substrate. The first fingers are interleaved with the second fingers such that two second fingers are interposed between each pair of adjacent two first fingers with each first finger constituting two first finger pairs with its adjacent first fingers on its both sides, and surface acoustic waves are produced when a first and a second voltage are applied to the first and second electrodes respectively. At least one reflective stripe is provided between the two second fingers interposed between at least one pair of adjacent two first fingers. The distances between the reflective stripe and the two second fingers and the widths of the two second fingers are determined such that acoustic waves produced by the fingers and propagating in a first direction perpendicular to the direction of the length of the fingers and reflected by the reflective stripe in a second direction opposite to the first direction are in phase with acoustic waves produced to propagate in the second direction and acoustic waves produced by the fingers and propagating in the second direction and reflected by the reflective stripe in the first direction are out of phase with acoustic waves produced to propagate in the first direction.

In accordance with another aspect of the present invention, there is provided a SAW resonator which comprises a piezoelectric substrate, a plurality of resonating SAW transducer units juxtaposed on the substrate in a direction of propagation of surface acoustic waves on the substrate and electrically connected with each other, and unidirectionally reflecting SAW transducer units having a reflection function and disposed on both ends respectively of the array of the juxtaposed resonating SAW transducer units.

DESCRIPTION OF THE PREFERRED EMBODIMENTS

For a better understanding of the present invention, a prior art SAW resonator shown in FIG. 1 will be described first, and the technical concept on which the present invention is based will then be described, before describing preferred embodiments of the present invention in detail.

Figure 1:
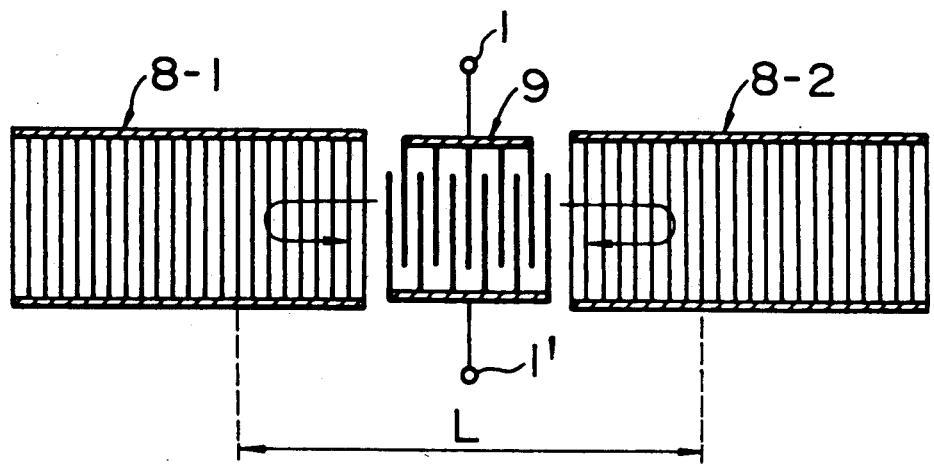
FIG. 1 the structure of a prior art SAW resonator of reflector type.

A prior art SAW resonator shown in FIG. 1 includes a transducer 9 formed on a piezoelectric substrate (not shown) to produce surface acoustic waves and a pair of reflectors 8-1 and 8-2 disposed on both sides respectively of the transducer 9. Each of these reflectors 8-1 and 8-2 is formed by depositing an array of thin-film metal stripes on the surface of the substrate or engraving an array of grooves in the surface of the substrate.

When an electrical signal is applied across electrical terminals 1 and 1', surface acoustic waves are produced from the transducer 9 to propagate leftward and rightward, that is, toward the reflectors 8-1 and 8-2 on the substrate, and the acoustic waves reflected from the reflectors 8-1 and 8-2 are incident on the transducer 9 from the left and right sides. Standing waves appear at a frequency where the produced acoustic waves and the reflected acoustic waves are in phase, and the SAW resonator resonates at that frequency.

The resonator shown in FIG. 1 is called a one-port resonator. The behavior of surface acoustic waves produced from the transducer 9 is such that, in the vicinity of the resonant frequency, the acoustic waves propagate to an effective reflection plane in each of the reflectors 8-1 and 8-2 and are reflected from such effective reflection planes. Generally, in the case of a reflector formed by an array of, for example, thin-film metal stripes, the amount of reflection per unit stripe is small, and many stripes must be used to provide a perfect reflector. Therefore, the effective reflection plane lies at a considerably deep position in the reflector. When the effective reflection planes of the left-hand and right-hand reflectors 8-1 and 8-2 are spaced apart from each other by a distance L, the resonator resonates under the following condition:

$$L \approx 2N\lambda_r \quad (1)$$

where N is a positive integer, and $\lambda_r$ is the wavelength at the resonant frequency. The value of $\lambda_r$ is given by $\lambda_r = V_o/f_r$, where $V_o$ is the velocity of the surface acoustic waves, and $f_r$ is the resonant frequency. Resonance of the next higher order occurs at a resonant frequency $f_r'$ which satisfies the following condition:

$$L \approx 2(N+1)\lambda_r' \quad (2)$$

The value of N is usually $N \geq 100$ in a SAW resonator commonly used in this field. In the case of $N = 100$, the following relation is obtained from the relations (1) and (2):

$$\frac{f_r' - f_r}{f_r} \approx \frac{1}{100} \quad (3)$$

Suppose that the anti-resonant frequency $f_a$ is approximately given by $f_a \approx (f_r + f_r')/2$. Then, the relative bandwidth $W_r$ of the resonator is given by the following equation (4):

$$W_r = \frac{\Delta f}{f_r} = \frac{f_a - f_r}{f_r} \approx 0.5\% \quad (4)$$

Figure 2:
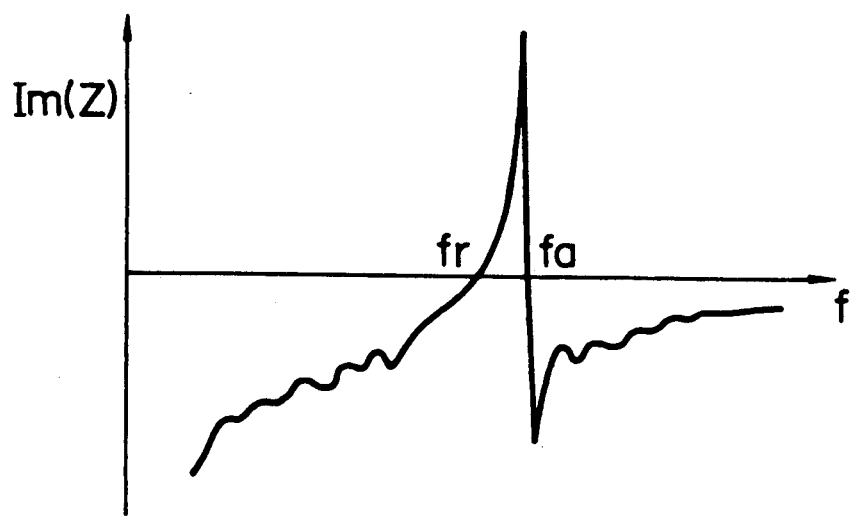
FIG. 2 shows the frequency characteristic of the impedance of the prior art resonator shown in FIG. 1.
Figure 3:
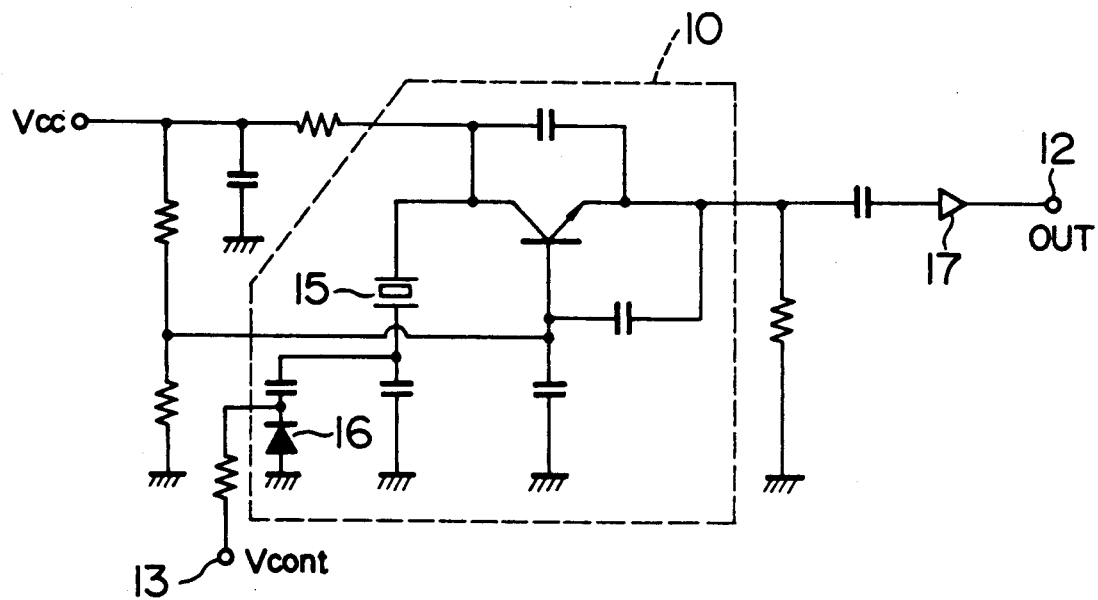
FIG. 3 is a circuit diagram of a voltage-controlled oscillator.

FIG. 2 shows an example of the frequency characteristic of the impedance of the prior art SAW resonator shown in FIG. 1. In FIG. 2, the horizontal axis represents the frequency f, and the vertical axis represents the imaginary part Im(Z) of the impedance Z of the resonator. In the bandwidth given by the equation (4), the impedance of the resonator is inductive in the range between the frequencies $f_r$ and $f_a$. Suppose that such a resonator is used as a resonator 15 in a voltage-controlled oscillator circuit 10 illustrated in FIG. 3 by way of example. In such a case, an oscillator can be realized in which, in response to a control voltage $V_{cont}$ applied to a variable capacitance diode 16 from a control input terminal 13, the frequency can be made theoretically variable in the range where the impedance of the resonator is inductive. An oscillation output appears at an output terminal 12 through an amplifier 17. Actually, however, since the variable capacitance diode (such as a varactor diode) has its capacitance variation range of 50% to 200% at most, it is impossible to make use of the whole frequency range, where the resonator acts as an inductor, as a frequency variable range of the oscillator. Thus, the utilizable range is considerably narrower than the illustrated range of $f_r - f_a$.

It will be seen from the above description that the distance L between the left-hand and right-hand effective reflection planes is very large in the prior art SAW resonator of the reflector type shown in FIG. 1. Because of the very large distance L, many standing waves can exist between the left-hand and right-hand effective reflection planes, and the value of the relative bandwidth of the resonator given by the equation (4) is very small. In SAW resonators known up to the present time, the relative bandwidth $W_r$ is limited to only 0.01% to 1.0% at the maximum, and, because of this limitation, a SAW resonator cannot be realized which can be incorporated in a voltage-controlled oscillator in a cellular radio system such as a mobile telephone system which requires a bandwidth of about 20 to 40 MHz (a relative bandwidth of about 3 to 5%) in a frequency band of 800 MHz.

Figure 4:
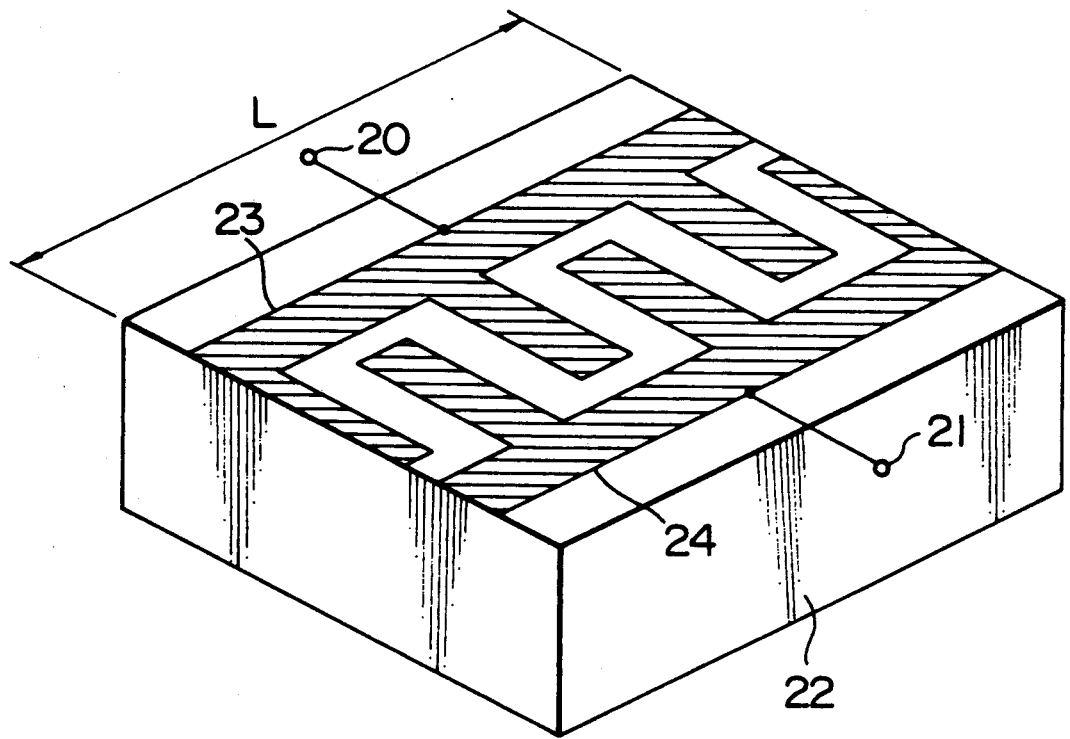
FIG. 4 is a schematic perspective view showing the concept of a polished end face SAW resonator.

FIG. 4 shows an ideal broad-band SAW resonator contemplated by the inventors. In the SAW resonator shown in FIG. 4, reflection planes corresponding to the effective reflection planes in the resonator shown in FIG. 1 are formed by cutting and polishing end faces of a piezoelectric substrate 22. Reference numerals 23 and 24 designate comb-like electrodes formed on the substrate 22, and 20 and 21 designate electrical signal input terminals. When the distance L between the reflection planes is selected to be sufficiently small, the value of N in the expression (1) can be made small. (The distance L may be selected to be equal to the length of the transducer.) Thus, by the provision of the polished end faces on the substrate, an ideal broad-band SAW resonator can be realized. When the value of N is, for example, $N = 5$, the relative bandwidth $W_r = \Delta f/f_r$ given by the equation (4) is about 10%.

Figure 5:
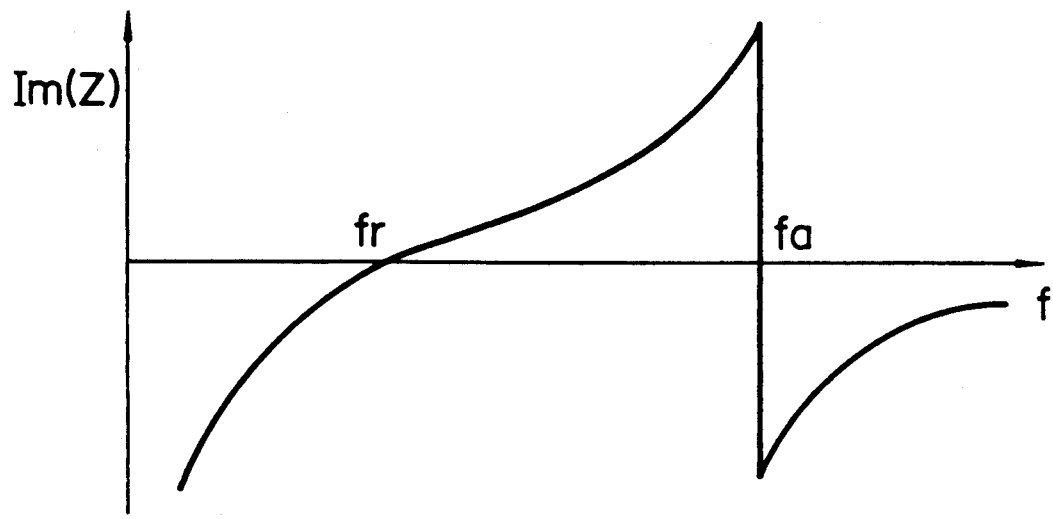
FIG. 5 shows the frequency characteristic of the impedance of the resonator shown in FIG. 4.

FIG. 5 is similar to FIG. 2 and shows an example of the frequency characteristic of the impedance of the polished end face SAW resonator shown in FIG. 4. The frequency characteristic shown in FIG. 5 is featured in that the range between the frequencies $f_r$ and $f_a$ is very large.

However, the polished end face SAW resonator shown in FIG. 4 has, for example, a problem of the mechanical accuracy of finishing the polished end faces of the substrate. Especially, in a cellular radio system using a high frequency, for example, a mobile telephone system using a frequency band of 800 MHz, the wavelength of surface acoustic waves is only about 5 $\mu$m, and it is virtually impossible to apply the polished end face SAW resonator to this frequency band.

Figure 6:
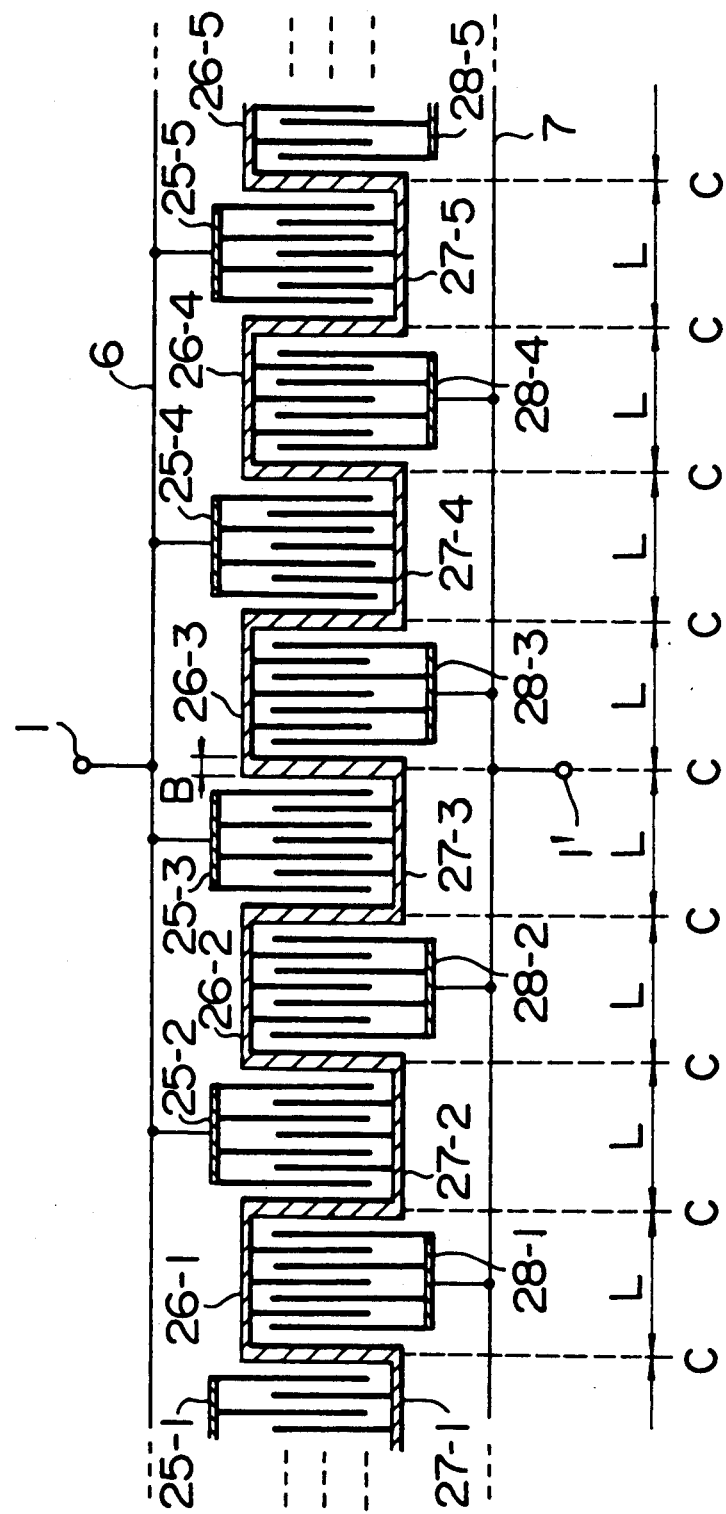
FIG. 6 shows the structure of an infinitely iterative SAW resonator.

Consider now an imaginary SAW resonator of a type in which its substrate is not formed with polished end faces and which has an impedance characteristic generally equivalent to that of the polished end face SAW resonator shown in FIG. 4. Such a SAW resonator is shown in FIG. 6. In the SAW resonator shown in FIG. 6, a pair of SAW transducers are electrically connected in series to form a basic unit, and such a basic unit is infinitely (imaginarily infinitely) iterated in a direction of propagation of surface acoustic waves.

More specifically, a plurality of SAW transducers having interleaved comb-like electrodes respectively are juxtaposed on a piezoelectric substrate (not shown) in a direction perpendicular to the direction of the length of fingers of the comb-like electrodes. In FIG. 6, the comb-like electrodes 25-1 and 27-1, 26-1 and 28-1, 25-2 and 27-2, —, 26-5 and 28-5 constitute the SAW transducers. The comb-like electrodes 25-1, 25-2, 25-3, 25-4 and 25-5 are connected by a common conductor 6 to a first terminal 1 to which a first voltage is applied, and the comb-like electrodes 28-1, 28-2, 28-3 and 28-4 are connected by a common conductor 7 to a second terminal 1' to which a second voltage is applied. A voltage intermediate between the first voltage applied to the first terminal 1 and the second voltage applied to the second terminal 1' is given to the comb-like electrodes 26-1, 26-2, 26-3, 26-4, 26-5 and the comb-like electrodes 27-1, 27-2, 27-3, 27-4, 27-5. The SAW transducer formed by the comb-like electrodes 25-1, 27-1 (a first SAW transducer) and the SAW transducer formed by the comb-like electrodes 26-1, 28-1 (a second SAW transducer); the SAW transducer formed by the comb-like electrodes 25-2, 27-2 (a first SAW transducer) and the SAW transducer formed by the comb-like electrodes 26-2, 28-2 (a second SAW transducer); —— constitute the series-connected SAW transducer pairs described above.

In the two transducers constituting each series-connected SAW transducer pair which forms the basic unit of the iterated arrangement (for example, the first SAW transducer formed by the comb-like electrodes 25-3, 27-3 and the second SAW transducer formed by the comb-like electrodes 26-3, 28-3), the number of fingers of the comb-like electrode (for example, 25-3) connected to the first terminal 1 is equal to that of the comb-like electrode (for example, 28-3) connected to the second terminal 1', and the remaining two comb-like electrodes (for example, 27-3 and 26-3) not connected to the terminals 1 and 1' have the same number of fingers. In FIG. 6 the reference symbol L designates ½ of the length of each transducer pair (the basic unit of iteration) in the direction of propagation of surface acoustic waves.

In FIG. 6, because of the symmetry of the resonator structure, surface acoustic waves having the same amplitude are always incident from the left and right sides toward the centerlines C between the interacted transducer pairs. When each of those centerlines C is noted, surface acoustic waves incident from the left side pass toward the right side, and, at the same time, surface acoustic waves having the same amplitude are incident from the right side to pass toward the left side. Therefore, in each of the SAW transducers, surface acoustic waves are observed as if acoustic waves incident from the left side are totally reflected at the centerline C between the SAW transducers to return toward the left side again, and acoustic waves incident from the right side are similarly totally reflected at the centerline C to return toward the right side again. Therefore, standing waves appear in the SAW resonator shown in FIG. 6 when the path B of propagation of surface acoustic waves between the individual SAW transducers is determined so that surface acoustic waves incident toward the centerline C between the SAW transducers and equivalent reflected acoustic waves are in phase, that is, so that the path B is equal to, for example, $(n+\frac{1}{2})$ times (n: a positive integer) as long as the wavelength of surface acoustic waves. Thus, a broad-band resonator having a width L between effective reflection planes extending along the centerlines C can be obtained. That is, this broad-band resonator has an impedance characteristic generally equivalent to that of a polished end face SAW resonator having a width L.

Figure 7:
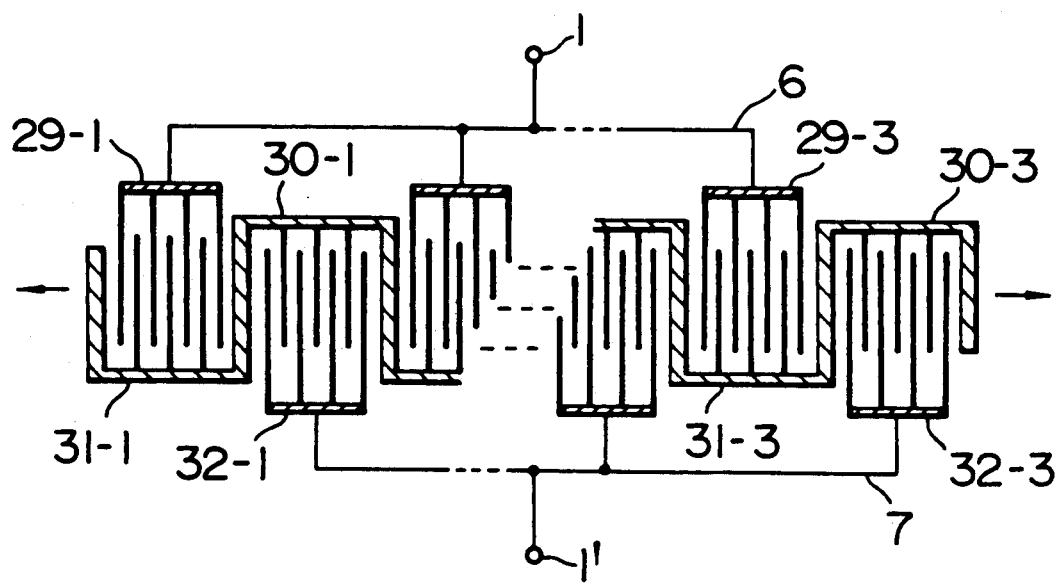
FIG. 7 shows the structure of a finitely iterative SAW resonator.

The impedance characteristic of the SAW resonator shown in FIG. 6 is generally equivalent to that shown in FIG. 5. Actually, however, when the factors including the area occupied by the resonator of the iterative type are taken into consideration, it is virtually impossible to form the resonator of the iterative type shown in FIG. 6 by infinitely iterating the series-connected SAW transducer pairs described above, and it is necessary to discontinue the iteration after the series-connected SAW transducer pairs are iterated a finite number of times. FIG. 7 shows a SAW resonator obtained by iterating a finite number of SAW transducer pairs. In FIG. 7, a SAW transducer formed by comb-like electrodes 29-1, 31-1 and a SAW transducer formed by comb-like electrodes 30-1, 32-1 constitute a left-end SAW transducer pair, while a SAW transducer formed by comb-like electrodes 29-3, 31-3 and a SAW transducer formed by comb-like electrodes 30-3, 32-3 constitute a right-end SAW transducer pair. The inventor found that, when the iteration of the SAW transducer pairs was discontinued after a finite number of the SW transducer pairs were iterated, the periodicity was impaired in the left-end and right-end SAW transducers, with the result that the impedance characteristic of the resonator was greatly adversely affected.

Figure 8:
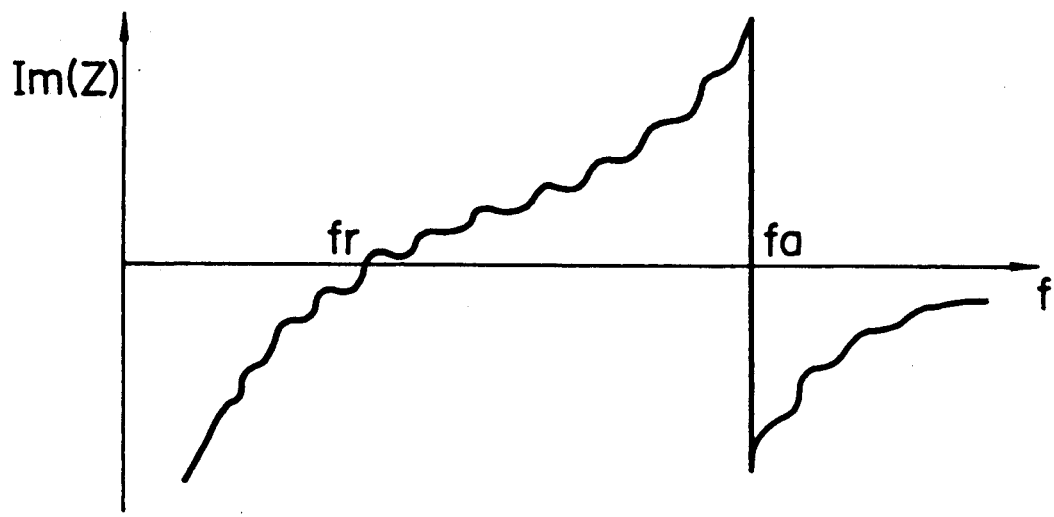
FIG. 8 shows the frequency characteristic of the impedance of the resonator shown in FIG. 7.

Although the adverse effect differs depending on the factors including the number of interacted transducer pairs and the length 2L of each of the iterated transducer pairs, there occurs generally a phenomenon in which considerable ripples appear in the impedance characteristic as shown in FIG. 8. This appearance of ripples in the impedance characteristic of the resonator is undesirable in that, when such a resonator is used as the resonator 15 in the voltage-controlled oscillator (VCO) 10 shown in FIG. 3, the oscillation frequency of the VCO 10 responsive to the control voltage $V_{cont}$ changes with a very bad linearity when the oscillation frequency is changed by changing the control voltage $V_{cont}$. In a worst case, so-called spring-over occurs in which the oscillation frequency of the VCO 10 changes discontinuously, and the resonator cannot be practically incorporated in the VCO 10.

Analysis by computer simulation was made so as to find the cause of appearance of ripples in the impedance characteristic shown in FIG. 8. In the case of the resonator shown in FIG. 6, effective reflection planes are necessarily formed at intervals of the distance L as a result of iteration of the SAW transducers. On the other hand, the resonator shown in FIG. 7 was experimentally formed by iteratively juxtaposing fifty SAW transducers, each having four pairs of fingers, in a direction of propagation of surface acoustic waves, and analysis by computer simulation was made on such a resonator. The results of the analysis proved that the periodicity was impaired in the SAW transducers located adjacent to the left and right ends of the resonator due to the iteration, and the effective reflection planes became indistinct in those areas, resulting in appearance of such ripples. The results of the analysis further proved that the effective reflection planes were not formed in the left-end and right-end SAW transducers because surface acoustic wages propagating leftward and rightward were not reflected but radiated directly toward the exterior of the resonator.

In order to prevent appearance of ripples in the impedance characteristic of the resonator, it is necessary to decrease the amount of surface acoustic waves radiated leftward and rightward or outward from the ends of the resonator. Polished end faces as shown in FIG. 4 are preferably formed on both ends of the resonator so as to prevent leftward and rightward radiation of surface acoustic waves from the ends of the resonator. When such polished end faces are provided, surface acoustic waves radiating leftward and rightward or outward are perfectly reflected so that an ideal SAW resonator similar to that shown in FIG. 4 can be provided. However, when the problem of the mechanical accuracy of finishing the polished end faces as described already is considered, the resonator cannot be used in a cellular radio system such as a mobile telephone system whose frequency band is 800 MHz. When the frequency is 800 MHz, the wavelength of surface acoustic waves is only about 5 μm. Therefore, even if the tolerance of finishing the polished end faces of the resonator may be ±1%, a mechanical accuracy of ±0.05 μm is required for the polished end faces, and finishing the polished end faces with such a very high mechanical accuracy is virtually impossible.

Figure 9:
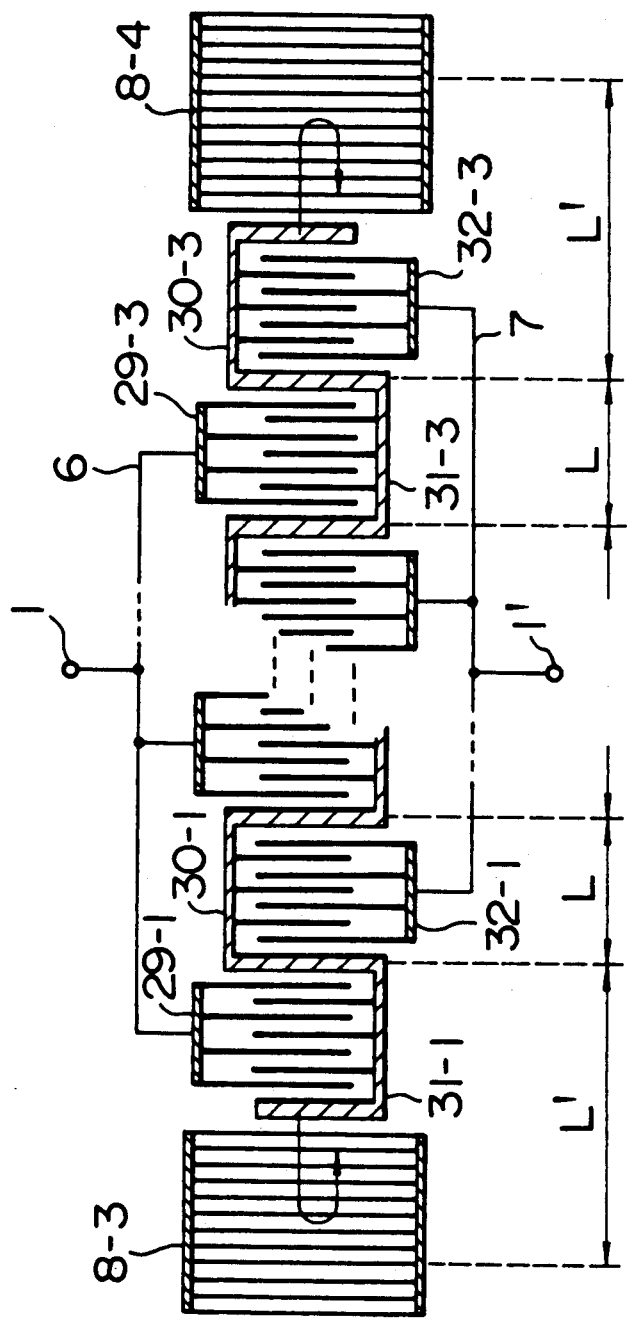
FIG. 9 shows the structure of a resonator in which a reflector is disposed on either side of the resonator shown in FIG. 7.

As another means for preventing leftward and rightward or outward radiation of surface acoustic waves, reflectors 8-3 and 8-4 as shown in FIG. 9 may be formed by depositing an array of thin-film metal stripes on the surface of the substrate or engraving an array of grooves in the surface of the substrate and disposed on both sides of the resonator of the type shown in FIG. 7. In the resonator structure shown in FIG. 9, the amount of surface acoustic waves radiated toward the exterior of the resonator can be decreased because acoustic waves radiated from the left-end and right-end SAW transducers are reflected by the respective reflectors 8-3 and 8-4 to return to those transducers again.

Figure 10:
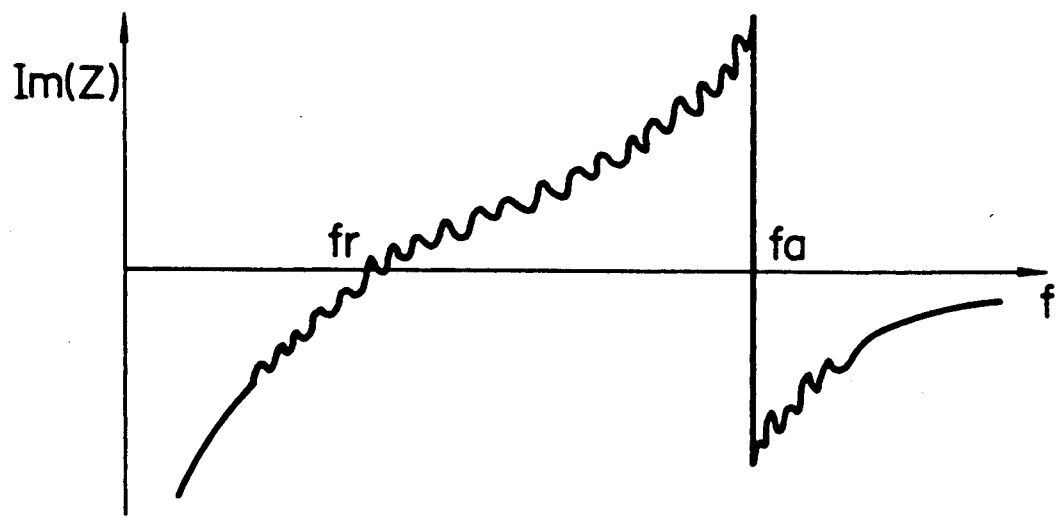
FIG. 10 shows the frequency characteristic of the impedance of the resonator shown in FIG. 9.

However, when the impedance characteristic of such a resonator was actually evaluated by means of computer simulation, it was found that, although the period of ripples could be decreased as shown in FIG. 10, ripples did not disappear, and the amplitude of the ripples did not appreciably differ from the case shown in FIG. 7 where the resonator does not include such reflectors. The reasons will now be discussed. On one hand, in the resonator structure shown in FIG. 9, surface acoustic waves radiated from the SAW transducer formed by the comb-like electrodes 29-1, 31-1 and SAW transducer formed by the comb-like electrodes 30-3, 32-3 and located at the left and right ends respectively of the resonator behave as if acoustic waves propagate toward the effective reflection planes of the left and right reflectors 8-3 and 8-4 and are then reflected from the effective reflection planes, with the result that the amount of change in the phase of surface acoustic waves is very large (L'>>L in FIG. 9), while, on the other hand, the effective reflection planes of the remaining transducers exist quite near those transducers, with the result that the amount of change in the phase of surface acoustic waves due to reflection is very small. Therefore, the relation between the phase of acoustic waves reflected and returning toward the transducers located at the both ends respectively of the resonator and the phase of acoustic waves equivalently regarded to be reflected and returning toward the remaining transducers is such that a change from the same phase to the opposite phase, a subsequent change from the opposite phase to the same phase, and so on periodically occur repeatedly with a period of a very small frequency interval. These repeated changes between the same phase and the opposite phase lead to appearance of ripples in the impedance characteristic of the resonator shown in FIG. 9.

The results of investigation by the inventors proved that, even when a finite number of SAW transducer pairs were juxtaposed without infinitely juxtaposing the transducer pairs, effective reflection planes similar to those described with reference to FIG. 6 could be attained by utilizing transducers of a novel structure for the transducers at both ends of the assembly including the juxtaposed transducers so that a broad band resonator could be obtained. Thus, a broad-band SAW resonator whose impedance characteristic is substantially free from ripples attributable to discontinuity of iteration of SAW transducer pairs and which is applicable to a voltage-controlled oscillator can be obtained when unidirectional SAW transducers each including an internal reflecting means are provided at both ends respectively of an array of a plurality of resonating SAW transducer units which are iterated in a direction of propagation of surface acoustic waves and each of which includes a pair of electrically series-connected SAW transducers.

Therefore, a SAW resonator can be provided which is applicable to a broad-band voltage-controlled oscillator, whose impedance characteristic includes a very small number of ripples, and for which an especially high mechanical accuracy for finishing is not required unlike a polished end face SAW resonator.

Figure 12:
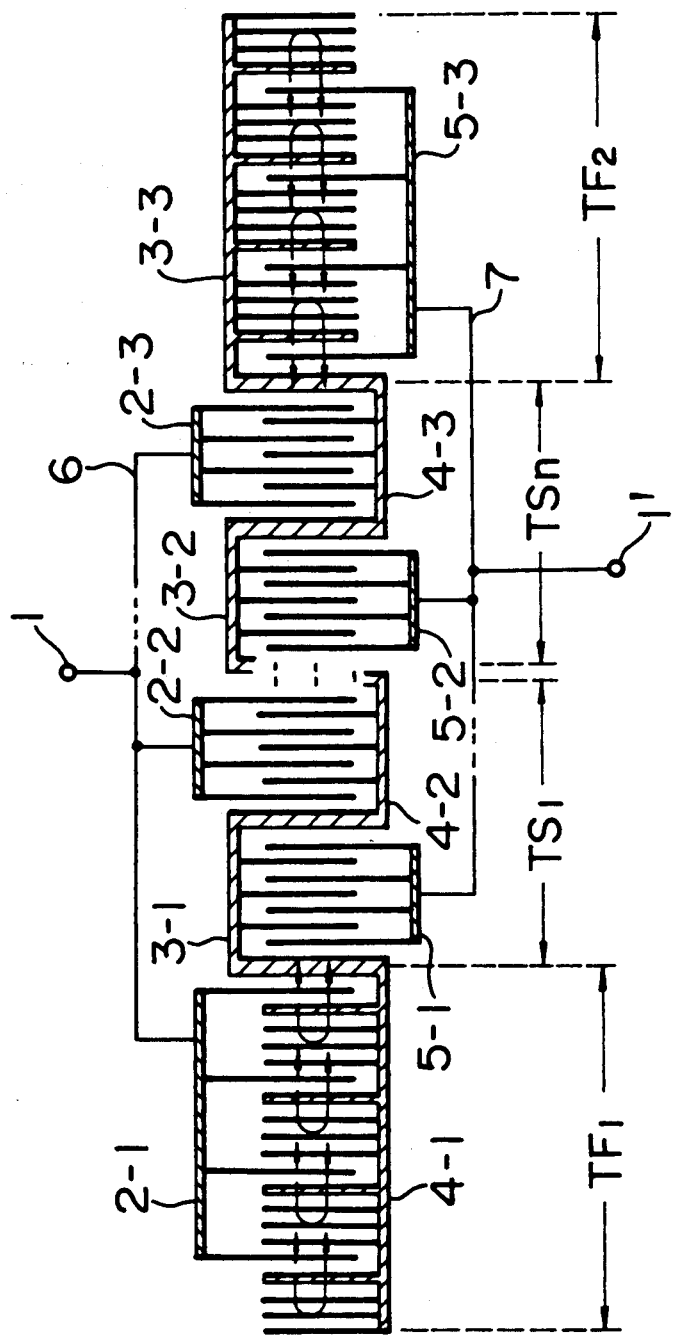
FIG. 12 shows the structure of an embodiment of the SAW resonator according to the present invention.

FIG. 12 shows a preferred embodiment of the present invention. In the case of the resonator structure shown in FIG. 9 which includes reflectors disposed at both ends thereof as described already, effective reflection planes are formed at considerably deep positions in these reflectors. The resonator structure shown in FIG. 9 has a problem such that the phase of surface acoustic waves is inevitably subjected to a change until acoustic waves are reflected from the effective reflection planes again after they reach the effective reflection planes. Therefore, it is necessary to provide a resonator structure in which such a change in the phase of surface acoustic waves is minimized, and the coefficient of wave reflection is sufficiently large.

The resonator structure shown in FIG. 12 satisfies these requirements. That is, reflectors are not disposed at both ends respectively of an array of a plurality of SAW transducer units iteratively juxtaposed in the direction of propagation of surface acoustic waves, but they are replaced by unidirectional SAW transducer units having a reflection function.

Figure 11A:
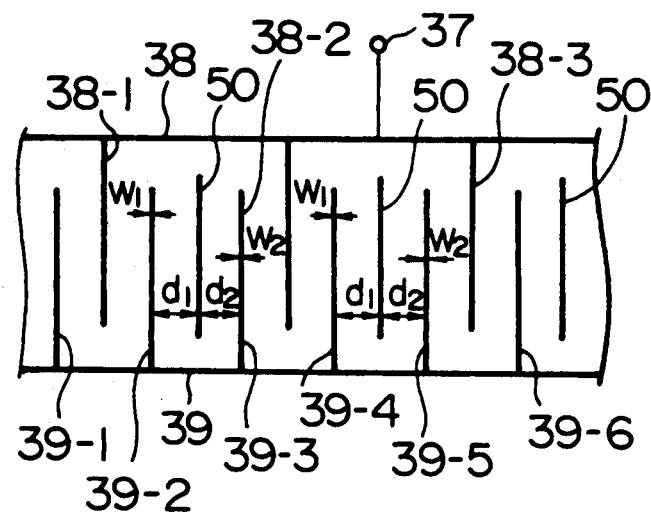
FIGS. 11a, 11b and 11c show the structure of an embodiment of the unidirectional SAW transducer having a reflection function according to the present invention.

Such a unidirectional SAW transducer unit is schematically shown in FIG. 11a. Referring to FIG. 11a, a comb-like electrode 38 having a plurality of fingers 38-1, 38-2 and 38-3 and connected to a terminal 37 to which a first voltage is applied is formed on a piezoelectric substrate (not shown) together with a comb-like electrode 39 which has a plurality of fingers 39-1, 39-2, 39-3, 39-4, 39-5 and 39-6 and to which a second voltage is applied. The two adjacent fingers 39-2, 39-3 and the two adjacent fingers 39-4, 39-5 of the comb-like electrode 39 are interposed between the two adjacent fingers 38-1, 38-2 and the two adjacent fingers 38-2, 38-3 of the comb-like electrode 38 respectively, so that these two comb-like electrodes 38 and 39 are interleaved relative to each other. At least one reflective stripe 50 is provided in each of the spaces between the two fingers 39-2 and 39-3 and between the two fingers 39-4 and 39-5 respectively of the comb-like electrode 39 interleaved with the comb-like electrode 38. The distances $d_1$, $d_2$ between the reflective stripe 50 and the fingers 39-2, 39-3 of the comb-like electrode 39, the distances $d_1$, $d_2$ between the reflective stripe 50 and the fingers 39-4, 39-5 of the comb-like electrode 39, and the widths $w_1$, $w_2$ of the fingers 39-1 to 39-6 of the comb-like electrode 39 are determined such that, when surface acoustic waves are produced from the comb-like electrodes 38 and 39 in response to the application of an electrical signal across the electrodes 38 and 39, surface acoustic waves produced to propagate, for example, rightward on the drawing sheet (in a first direction perpendicular to the direction of the length of the fingers) and reflected by the reflective stripes 50 to return leftward on the drawing sheet (in a second direction opposite to the first direction) are in phase with those produced to propagate leftward, while surface acoustic waves produced to propagate leftward and reflected by the reflective stripes 50 to return rightward are out of phase with those produced to propagate rightward. Each of the reflective stripes 50 may be a metal strip formed on the surface of the substrate, a slender groove formed in the surface of the substrate, a dielectric metal strip formed on the surface of the substrate, or an impurity introduced slender region such as an ion implanted slender region or a diffused slender region formed in the surface of the substrate. Examples of the impurities to be diffused are titanium and proton, while examples of the ions to be implanted are titanium ions, protons and hydrogen ions. Although the reflective stripe 50 is provided between the two fingers of the comb-like electrode 39 interposed between the two adjacent fingers of the comb-like electrode 38, the requirement is at least such that the reflective stripe 50 is to be disposed anywhere between the two fingers of the comb-like electrode 39 interposed between a pair of two adjacent fingers of the comb-like electrode 38.

The length of the reflective stripe may be preferably no smaller than about ⅓ the width of the region in which surface acoustic wave propagate, the width being perpendicular to the surface acoustic wave propagation direction.

Figure 11B:
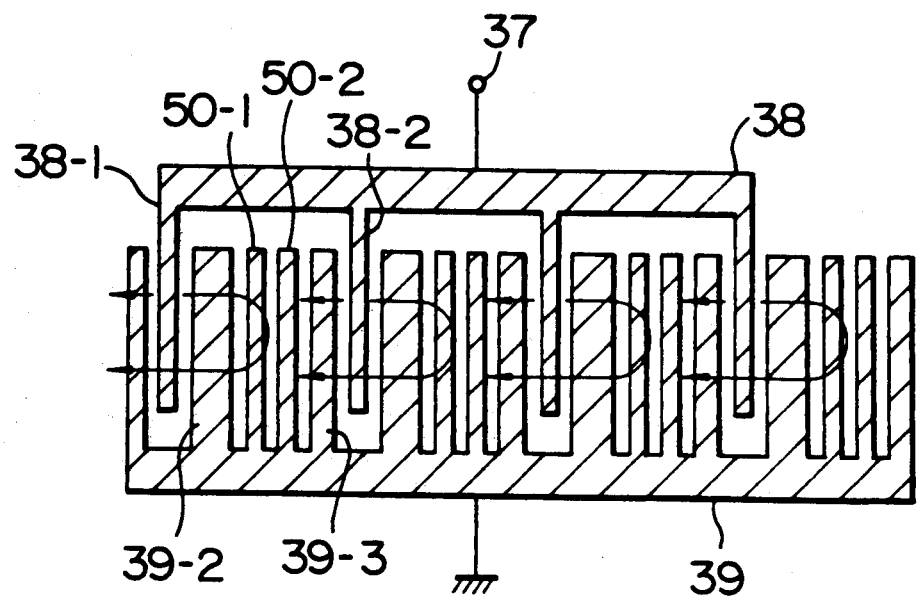

FIG. 11b shows an exemplary structure in which an array of metal strips are used to constitute reflective stripes 50 in the unidirectional SAW transducer unit. Referring to FIG. 11b, two reflective stripes (metal strips) 50-1 and 50-2 are provided between the two fingers (39-2, 39-3, etc.) of the comb-like electrode 39 interposed between each of the finger pairs (38-1, 38-2, etc.) formed by the two adjacent fingers respectively of the comb-like electrode 38, and all of those reflectors are electrically connected to the comb-like electrode 39.

When the widths of the wave-producing fingers of the comb-like electrode 39 and/or the distances between those fingers and the reflectors are suitably selected, surface acoustic waves produced by the wave-producing fingers to directly propagate in one direction (for example, leftward in FIG. 11b) as shown by the arrows are in phase with those reflected from the reflectors, thereby intensifying each other. On the other hand, surface acoustic waves produced by the wave-producing fingers to directly propagate in the opposite direction are out of phase with those from the reflectors, thereby weakening each other. Therefore, the transducer structure shown in FIG. 11b is of the unidirectional type in which the transducer itself produces surface acoustic waves propagating in one direction only.

Figure 11C:
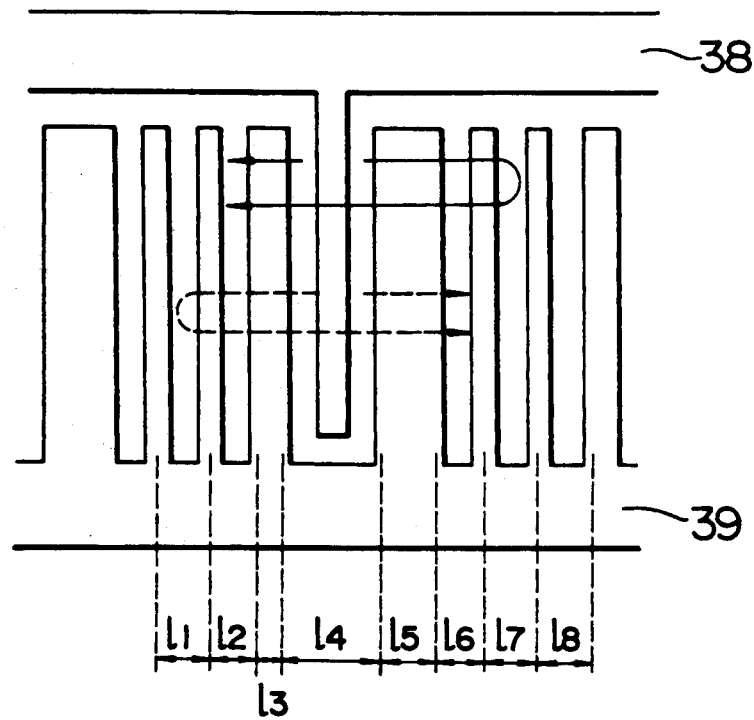

The unidirectional transducer shown in FIG. 11b will be described in further detail with reference to FIG. 11c which is an enlarged view of part of FIG. 11b. Referring to FIG. 11c, the reflectors (shown by $l_1$, $l_2$ and $l_6$, $l_7$) lie on both side of the wave-producing fingers (shown by $l_4$). When the distance (shown by $l_5$) between the right-hand wave-producing finger and the adjacent reflector is suitably selected (⅛ of the wavelength when the reflective stripe is a metal strip), surface acoustic waves produced from the wave-producing fingers to directly propagate leftward are in phase with those propagating rightward and reflected from the reflectors ($l_6$, $l_7$) as shown by the solid lines so that these acoustic waves intensify each other. On the other hand, when the distance (shown by $l_3$) between the left-hand wave-producing finger and the adjacent reflector is suitably selected (⅛ of the wavelength when the reflective stripe is a metal strip), surface acoustic waves produced from the wave-producing fingers to directly propagate rightward are out of phase with those propagating leftward and reflected from the reflectors ($l_1$, $l_2$) as shown by the broken lines, so that these acoustic waves weaken each other. Thus, according to the transducer structure shown in FIG. 11c, surface acoustic waves propagating leftward can only be intensified.

In the unidirectional SAW transducer shown in FIG. 11b, the wave-producing fingers and the reflectors are disposed alternately. Therefore, surface acoustic waves propagating rightward are weakened by acoustic waves of opposite phase reflected from the individual reflectors, and, as a result, a very small amount of acoustic waves leak to the exterior from the right-hand end of the transducer. On the other hand, surface acoustic waves propagating leftward are intensified by those of the same phase reflected from the individual reflectors, and, as a result, a very large amount of surface acoustic waves are radiated from the left-hand end of the transducer.

FIG. 12 shows the resonator structure in which the unidirectional SAW transducer having the structure shown in FIG. 11b is used as each of end transducers located at both ends of a SAW resonator of the type in which a finite number of resonating SAW transducer units each consisting of a pair of electrically series-connected SAW transducers are iterated.

The SAW resonator shown in FIG. 12 includes a plurality of resonating SAW transducer units $TS_1$, ---, $TS_n$ juxtaposed on a piezoelectric substrate (not shown) in a direction of propagation of surface acoustic waves, and unidirectionally reflecting SAW transducer units $TF_1$ and $TF_2$ formed on the substrate on both sides respectively of the array of the juxtaposed plural resonating SAW transducer units. An electrical signal is applied across electrical terminals 1 and 1'. Each of the resonating SAW transducer units $TS_1$, ---, $TS_n$ includes a first SAW transducer and a second SAW transducer. The first SAW transducer includes a comb-like electrode 2-2 or 2-3 connected by a common conductor 6 to the terminal 1 to which a first voltage is applied, and a comb-like electrode 4-2 or 4-3 to which a voltage intermediate between the first voltage and a second voltage applied to the terminal 1' is applied through the substrate. The second SAW transducer includes a comb-like electrode 3-1 or 3-2 to which the voltage intermediate between the first and second voltages is applied, and a comb-like electrode 5-1 or 5-2 connected by a common conductor 7 to the terminal 1' to which the second voltage is applied. The second SAW transducer is electrically connected in series with the first SAW transducer. The unidirectionally reflecting SAW transducer units $TF_1$ and $TF_2$ may have a structure similar to that shown in FIG. 11b. The transducer unit $TF_1$ includes a first comb-like electrode 2-1 connected to the terminal 1 and a second comb-like electrode 4-1 connected (coupled) to the comb-like electrode 3-1 of the transducer unit $TS_1$. The transducer unit $TF_2$ includes a first comb-like electrode 3-3 connected (coupled) to the comb-like electrode 4-3 of the transducer unit $TS_n$ and a second comb-like electrode 5-3 connected to the terminal 1'. The electrode finger arrangement in the transducer units $TF_1$ and $TF_2$ is similar to that described already with reference to FIGS. 11b and 11c.

In FIG. 12, although the transducer units $TS_1$, ---, $TS_n$ are physically and electrically connected with one another through the comb-like electrodes 4-2, 3-2 and so on, they may be disconnected from one another. The same is true with respect to the connections between the transducer units $TF_1$ and $TS_1$ and between the transducer units $TS_n$ and $TF_2$.

The piezoelectric substrate of the SAW resonator shown in FIG. 12 is made of a conventional piezoelectric material, for example, $LiNbO_3$, $LiTaO_3$, quartz, or the like.

In the embodiment of the SAW resonator shown in FIG. 12, effective reflection planes are formed in the interior of the resonator as a result of iteration of the SAW transducers Although the effective reflection planes may become indistinct in the vicinity of the both ends of the resonator due to impairment of the periodicity, this periodicity impairment can be minimized when the unidirectional SAW transducer shown in FIG. 11b is used as each of the reflecting transducer units located at the both ends of the SAW resonator. Thus, the SAW resonator shown in FIG. 12 exhibits a frequency characteristic very close to the frequency characteristic of the impedance of the resonator of the infinite iterative type.

Figure 13:
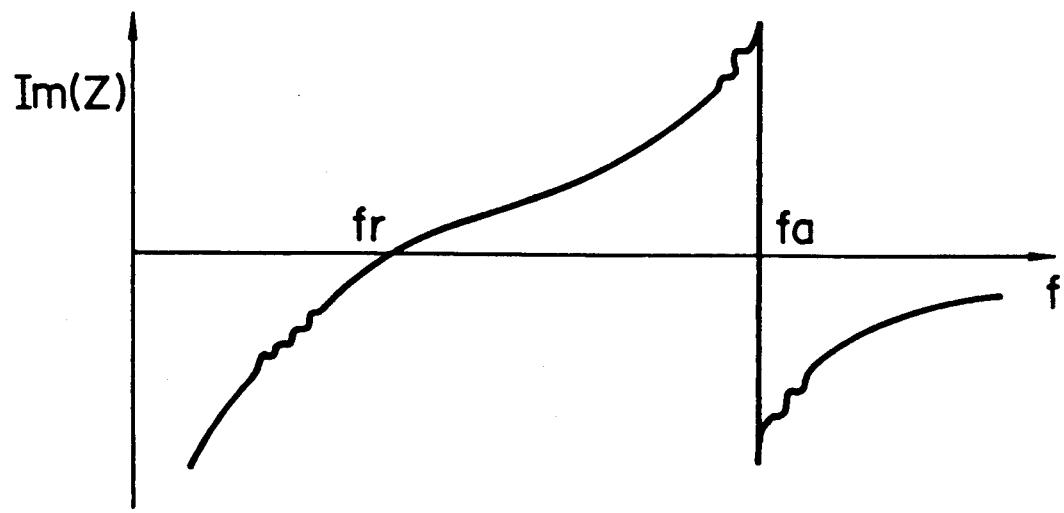
FIG. 13 shows the frequency characteristic of the impedance of the resonator shown in FIG. 12.

FIG. 13 shows the frequency characteristic of the impedance of the SAW resonator shown in FIG. 12. This frequency characteristic is quite analogous to the frequency characteristic of the impedance of the polished end face resonator shown in FIG. 5. It will be seen in FIG. 13 that ripples are substantially eliminated when the frequency characteristic is compared with the frequency characteristic of the impedance of the resonator of the finite iterative type as shown in FIG. 8 and also when compared with the frequency characteristic of the impedance of the resonator of the finite iterative type having the reflectors at its both ends as shown in FIG. 10.

In the frequency characteristic shown in FIG. 13, some ripples remain on a very lower side of the resonant frequency $f_r$ and in the neighborhood of the antiresonant frequency $f_a$, and this means that the resonator structure shown in FIG. 12 is not as ideal as the polished end face resonator shown in FIG. 4. However, when the SAW resonator shown in FIG. 12 is practically used as, for example, the resonator 15 in the voltage-controlled oscillator (VCO) 10 shown in FIG. 3, the oscillation frequency is quite close to the resonant frequency $f_r$ of the resonator, and the presence of ripples on a very lower side of the resonant frequency $f_r$ does not adversely affect the operation of the VCO 10.

According to a common practice for designing an ordinary voltage-controlled oscillator, the oscillation frequency is selected to be close to the resonant frequency of a resonator incorporated in the oscillator, and the variable range of the oscillation frequency is selected to be, for example, 80% or less of the difference $\Delta f$ between the antiresonant frequency $f_a$ and the resonant frequency $f_r$. Therefore, in practical applications, appearance of ripples in the vicinity of the antiresonant frequency $f_a$ does not pose any problem as in the case of appearance of ripples on a very lower side of the resonant frequency $f_r$.

The broad-band SAW resonator described above can be applied to a voltage-controlled oscillator (VCO) for use in a cellular radio system such as an 800-MHz mobile telephone system. It will be seen from FIG. 12 showing the structure of the broad-band SAW resonator that the resonating transducer units are iterated so as to secure the impedance required for the broad-band SAW resonator, and the unidirectional transducer units having the internal reflection function are used as the left-end and right-end transducer units so as to substantially eliminate ripples appearing in the frequency characteristic of the impedance and adversely affecting the performance in practical applications.

Figure 14:
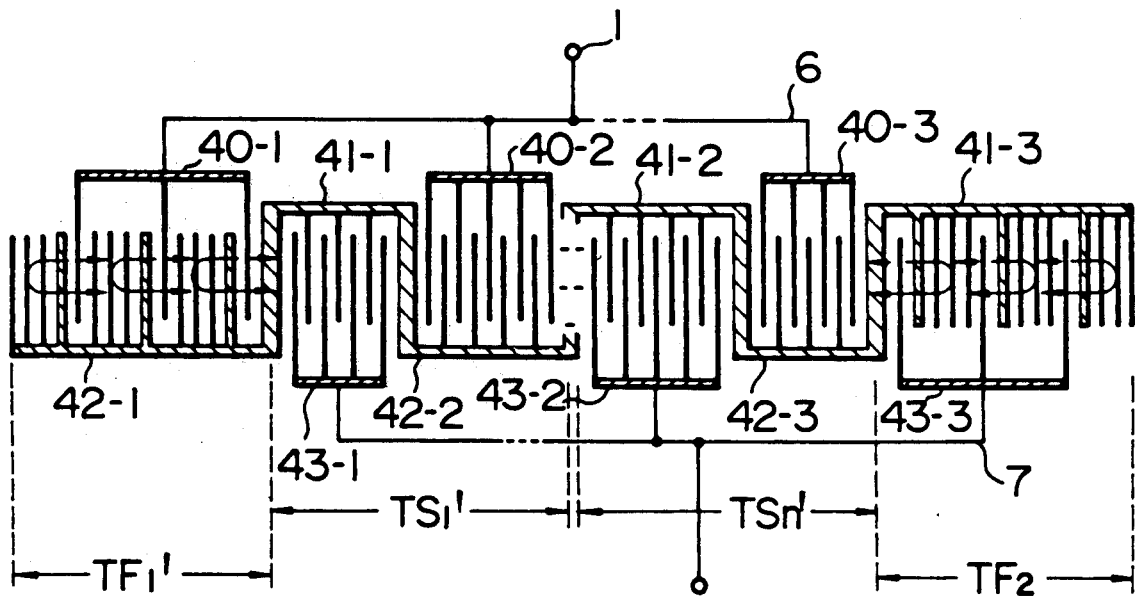
FIGS. 14 and 15 show the structure of other embodiments of the SAW resonator according to the present invention.

FIG. 14 shows another embodiment of the present invention. The resonator structure shown in FIG. 14 is the same as that of the embodiment shown in FIG. 12 in that resonating transducer units are iterated to form effective reflection planes, and unidirectional transducer units having a reflection function in each of them are used as left-end and right-end transducer units. The embodiment shown in FIG. 14 differs from that shown in FIG. 12 in that the number of fingers of comb-like electrodes of individual transducer units constituting the resonator (or the number of effective finger pairs, that is, the number of wave-producing finger pairs) is selected to be large in the middle part of the resonator and selected to become progressively smaller toward the ends of the resonator.

More specifically, in the SAW resonator structure shown in FIG. 14, the number of effective pairs of fingers in reflecting transducer units $TF_1'$ and $TF_2'$ disposed at the left and right ends respectively of the resonator is three, the number of effective finger pairs in inner transducers formed by comb-like electrodes 41-1, 43-1 and 40-3, 42-3 in resonating transducer units $TS_1'$ and $TS_n'$ respectively is four, and the number of effective finger pairs in further inner transducers formed by comb-like electrodes 40-2, 42-2 and 41-2, 43-2 in the resonating transducer units $TS_1'$ and $TS_n'$ respectively is five. When the number of effective finger pairs in the transducers is selected to become progressively smaller from the middle part toward the ends of the resonator, the amplitude of surface acoustic waves produced at the middle part of the resonator can be made large, and that of surface acoustic waves produced at outer parts can be made small, while, at the same time, securing necessary effective reflection planes by iteration of the transducers. Therefore, the oscillation energy can be confined in the middle part of the resonator, so that the resonator can operate with a high quality factor. Further, because the unidirectional transducers having the internal reflective stripe arrays are used as the reflecting SAW transducers located at the ends of the resonator, the resonator can operate as an ideal resonator in which a very small number of ripples appear in the frequency characteristic of its impedance. In the resonator structure shown in FIG. 14, the effect similar to that described above can also be expected when the number of fingers in the reflecting SAW transducer units $TF_1'$ and $TF_2'$ is selected to be at least smaller than that in the resonating SAW transducer units $TS_1'$, ---, $TS_n'$.

Figure 15:
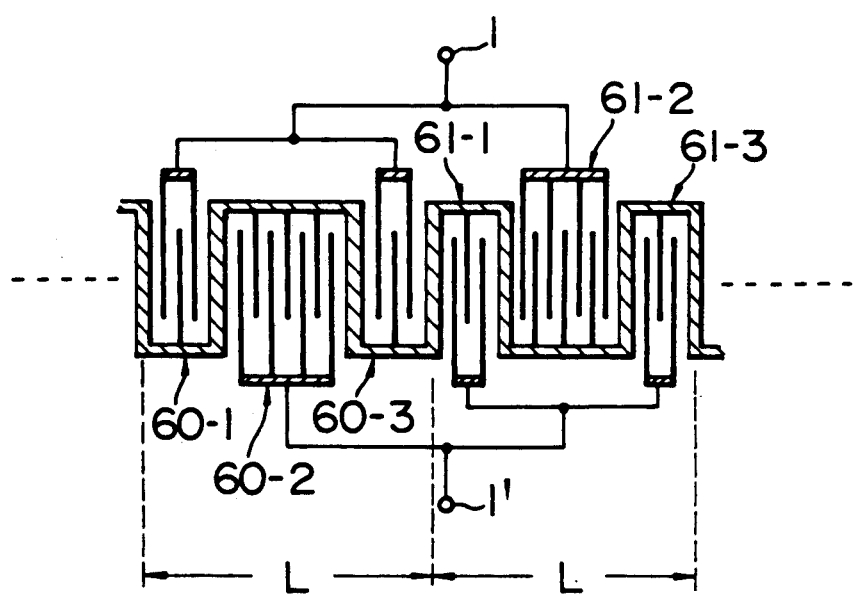

As described with reference to FIG. 12 showing a basic embodiment of the SAW resonator of the present invention, the basic unit used for iteration is a resonating SAW transducer unit including a pair of transducers electrically connected in series with each other. However, fundamental requirements for the SAW resonator of the present invention are formation of effective reflection planes by periodic iteration of SAW transducer structures and provision of unidirectional SAW transducers at both ends of the resonator. Therefore, the basic unit used for iteration need not necessarily be the series-connected transducer pair (that is, the resonating SAW transducer unit) shown in FIG. 12. FIG. 15 shows another embodiment of the SAW resonator according to the present invention. Referring to FIG. 15, SAW transducers 60-1 to 61-3 are juxtaposed in a direction of propagation of surface acoustic waves, and the SAW transducers 60-1, 60-2 and 61-1, 61-2 are connected in series, while the SAW transducers 60-1, 60-3 and 61-1, 61-3 are connected in parallel. It will be self-apparent that iteration of the combination of the series connections and parallel connections of such SAW transducers provides a SAW resonator satisfying the above requirements' too.

A SAW resonator is incorporated in a voltage-controlled oscillator (VCO) which is an essential part of a cellular radio system, for example, a mobile telephone system, for the purpose of decreasing the size and weight of and improving the performance of the terminal equipment of the mobile telephone system. However, in the case of a prior art SAW resonator, the bandwidth was narrow, and the variable range that could be secured was only about 0.01 to 1.0% of the center frequency. On the other hand, according to the aforementioned embodiments of the SAW resonator of the present invention, the bandwidth of 20 to 40 MHz (the relative bandwidth of 3 to 5%) required in, for example, the frequency band of 800 MHz could be secured. Further, when the number of effective finger pairs in the transducers was progressively decreased from the middle part toward the ends of the SAW resonator, the quality factor could be further increased, and the performance of the VCO could be improved.

The chip size of the SAW resonator is only about 1/100 of that of a dielectric resonator. Therefore, incorporation of the SAW resonator in the VCO can decrease the overall size of the VCO and greatly contributes to the desired reduction in the size and weight of the terminal equipment of the mobile telephone system.

We claim:

1. A SAW resonator comprising:
    a piezoelectric substrate;
    a plurality of resonating SAW transducer units formed on said substrate and juxtaposed in a direction of propagation of acoustic waves on said substrate, each of said resonating SAW transducer units including at least one first SAW transducer and at least one second SAW transducer electrically connected with each other and juxtaposed in said acoustic wave propagation direction on said substrate; and
    first and second unidirectionally reflecting SAW transducer units formed on said substrate and arranged to be juxtaposed in said acoustic wave propagation direction with respect to said plurality of juxtaposed resonating SAW transducer units on first and second ends thereof, respectively.

2. A SAW resonator according to claim 1, in which each of said first and second unidirectionally reflecting SAW transducer units comprise first and second comb-like electrodes having a plurality of first fingers and a plurality of second fingers, respectively, formed on said substrate, wherein:
    said first fingers are interleaved with said second fingers such that two second fingers are interposed between each adjacent two first fingers, acoustic waves being produced when first and second voltages are applied to said first and second electrodes, respectively;
    at least one reflective stripe is provided between said two second fingers interposed between each adjacent two first fingers; and
    the distances between said reflective stripe and said two second fingers and the widths of said two second fingers are determined such that acoustic waves produced by said fingers and propagating in a first direction perpendicular to the direction of the length of said fingers and reflected by said reflective stripe in a second direction opposite to said first direction are in phase with acoustic waves propagating in said second direction and acoustic waves produced by said fingers and propagating in said second direction and reflected by said reflective stripe in said first direction are out of phase with acoustic waves propagating in said second direction.

3. A SAW resonator according to claim 1, in which each of said resonating SAW transducer units includes one first SAW transducer and one second SAW transducer electrically connected in series with each other.

4. A SAW resonator according to claim 1, in which each of said resonating SAW transducer units includes a plurality of first SAW transducers and a plurality of second SAW transducers alternately juxtaposed in said acoustic wave propagation direction, said plurality of first SAW transducers being electrically connected in parallel with each other, and said plurality of second SAW transducers being electrically connected in parallel with each other.

5. A SAW resonator according to claim 1, in which each of said first and second unidirectionally reflecting SAW transducer units comprises first and second comb-like electrodes having a plurality of first fingers and a plurality of second fingers, respectively, formed on said substrate, wherein:
    said first fingers are interleaved with said second fingers such that two second fingers are interposed between each pair of adjacent two first fingers with each said first finger constituting two first finger pairs with its adjacent first fingers on its both sides, acoustic waves being produced when first and second voltages are applied to said first and second electrodes, respectively;
    at least one reflective stripe is provided between said two second fingers interposed between at least one pair of adjacent two first fingers; and
    the distances between said reflective stripe and said two second fingers and the widths of said two second fingers are determined such that acoustic waves propagating in a first direction perpendicular to the direction of the length of said fingers and reflected by said reflective stripe in a second direction opposite to said first direction are in phase with acoustic waves propagating in said second direction and acoustic waves propagating in said second direction and reflected by said reflective stripe in said first direction are out of phase with acoustic waves propagating in said second direction.

6. A SAW resonator according to claim 5, in which said stripe is a metal strip formed on said substrate.

7. A SAW resonator according to claim 5, in which said stripe is a slender groove formed in said substrate.

8. A SAW resonator according to claim 5, in which said stripe is a dielectric material strip formed on said substrate.

9. A SAW resonator according to claim 5, in which said stripe is an impurity introduced slender region formed in said substrate.

10. A SAW resonator according to claim 5, in which the number of the sum of said first and second fingers in each of said first and second unidirectionally reflecting SAW transducer units is smaller than the number of fingers of any of said first and second SAW transducers in said resonating SAW transducer units.

11. A SAW resonator according to claim 10, in which the numbers of fingers for the SAW transducers in said plurality of juxtaposed resonating SAW transducer units are determined such that the number of fingers for one or two SAW transducers in that resonating SAW transducer unit which is situated in the center of said plurality of juxtaposed resonating SAW transducer units is the largest and the number of fingers of any other SAW transducer is smaller than that of a SAW transducer situated more inwardly.

12. A SAW resonator according to claim 5, wherein said reflective stripe comprises a reflector strip electrically connected to said second comb-like electrode.

13. A SAW resonator according to claim 2, wherein said reflective stripe comprises a reflector strip electrically connected to said second comb-like electrode.

* * * * *